ELECTRON BEAM DEFLECTION APPARATUS

Original Filed Feb. 24, 1971 3 Sheets-Sheet 1

ELECTRON BEAM DEFLECTION APPARATUS

Original Filed Feb. 24, 1971 3 Sheets-Sheet 2

ELECTRON BEAM DEFLECTION APPARATUS

Original Filed Feb. 24, 1971 3 Sheets-Sheet 3

United States Patent Office

Re. 28,223
Reissued Nov. 5, 1974

28,223

ELECTRON BEAM DEFLECTION APPARATUS

Conrad J. Odenthal, Beaverton, and George K. Hashizume, Portland, Oreg., assignors to Tektronix, Inc., Beaverton, Oreg.

Original No. 3,694,689, dated Sept. 26, 1972, Ser. No. 118,293, Feb. 24, 1971. Application for reissue Oct. 27, 1972, Ser. No. 301,631
Int. Cl. H01j *25/36, 29/70;* H03h *7/30*
U.S. Cl. 315—3 22 Claims

Matter enclosed in heavy brackets [ ] appears in the original patent but forms no part of this reissue specification; matter printed in italics indicates the additions made by reissue.

ABSTRACT OF THE DISCLOSURE

A delay line type of deflection apparatus for deflecting an electron beam in a cathode ray tube is described, which includes a *pair* of helical deflector members having rectangular turns each having a pair of flat side portions separated by a deflector portion of different width. Two pairs of grounded adjustable compensator plates are positioned adjacent the flat side portions on opposite sides of both helical members to form delay lines of substantially uniform characteristic impedance. The width and spacing of adjacent deflection portions is substantially uniform while the width and spacing of adjacent side portions varies for successive turns along the path of the electron beam. This provides the deflection apparatus with good deflection sensitivity, an extremely wide bandwidth frequency response from DC to over one gigahertz and a high characteristic impedance of about 365 ohms.

BACKGROUND OF THE INVENTION

The subject matter of the present invention relates generally to delay line types of electron beam deflection apparatus, and in particular to a helical delay line deflection apparatus for cathode ray tubes and the like which is capable of extremely high frequency response. A delay line deflection apparatus is used to reduce the deflection signal velocity in the axial direction along the helical deflector until it is equal to the electron beam velocity to enable very high frequency signals to deflect the beam without appreciable distortion.

Previous delay line deflection structures have less deflection sensitivity and are not capable of as great a high frequency response compared to the present deflection apparatus. Thus, the deflection apparatus of the present invention has a wide bandwidth frequency response from D.C. to over 1 gigahertz. In addition to these advantages, the delay line formed by the deflection apparatus has a high characteristic impedance on the order of 365 ohms so that it does not greatly reduce the load of the vertical amplifier which is the source of the deflection signal for the cathode ray tube of an oscilloscope employing such deflection apparatus.

Previous delay line deflection apparatus have been of the meander line type such as shown in U.S. Pat. No. 2,922,074 of Moulton, and the helical delay line of the type such as shown in U.S. Pat. No. 3,005,128 of Goldberg et al. While the meander line type deflector is simpler and less expensive to manufacture, it does not have as great a deflection sensitivity and high frequency response or as high impedance as the helical deflector. Previous helical deflectors have been in the form of metal wires or ribbons of uniform width wound into a helix which is flattened on at least the deflector portion adjacent the electron beam. However, unlike the helical deflector of the present invention, they were not provided with deflector portions of different width than the side portions or with side portions whose width and spacing varies along the beam path to compensate for divergence of the output ends of the helical deflectors and maintain a substantially uniform characteristic impedance of high value.

In addition, unlike the present invention, the prior art helical deflection apparatus did not employ compensator plates adjacent the flat opposite sides of both helical deflectors to form the ground conductor of the delay line and to shield the beam from external fields. Also, these compensator plates can be adjusted to change their spacing from the deflectors and thereby tune the delay line to provide a more uniform characteristic impedance. Another advantage of the present deflection apparatus is the use of sharpened input and output edges on the deflection portion of the turns to reduce the signal coupling capacitance between adjacent deflection portions which causes distortion, while maintaining a strong deflection field between the opposite deflection portion of the two helical deflectors for good deflection sensitivity.

It is therefore one object of the present invention to provide an improved delay line type of electron beam deflection apparatus which is capable of good deflection sensitivity and an extremely high frequency response.

Another object of the invention is to provide such a deflection apparatus with helical deflection members having deflector portions of a different width than the side portions and with the width and spacing of the side portions varying along the beam path in order to provide a delay line of substantially uniform characteristic impedance.

A further object of the invention is to provide such a deflection apparatus in which compensator plates are provided adjacent the flat sides of both deflectors to provide delay lines of substantially uniform characteristic impedance.

An additional object of the invention is to provide such a deflection apparatus in which the compensator plates are adjustable relative to the deflectors to tune the delay line.

Still another object of the present invention is to provide a cathode ray tube employing such a deflection apparatus.

A still further object of the present invention is to provide such a deflection apparatus of faster rise time in which the two helical members on opposite sides of the electron beam are wound in the same direction so that a signal flows in opposite directions through their deflection plate portions to provide a negative mutual inductive coupling therebetween.

Additional objects and advantages will be apparent from the following detailed description of the preferred embodiment thereof and from the attached drawings of which:

DESCRIPTION OF PREFERRED EMBODIMENT

Figure 1:
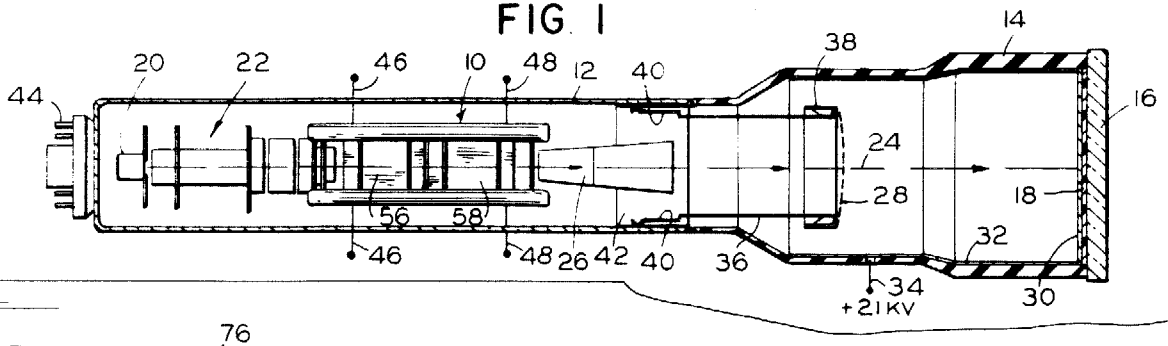
FIG. 1 is a longitudinal section view of a cathode ray tube employing the deflection apparatus of the present invention.

As shown in FIG. 1, a delay line type of electron beam deflection apparatus 10 in accordance with the present invention is contained within the evacuated envelope of a cathode ray tube. The envelope includes a glass neck portion 12, a ceramic funnel portion 14, and a glass face plate portion 16 which are sealed together by glass to ceramic seals of devitrified glass as shown in U.S. Pat. No. 3,207,936 of Wilbanks et al. A layer of phosphor material 18 forming the fluorescent screen of the tube is coated on the inner surface of the glass face plate 16 at one end of the envelope. A cathode 20 which emits the electron beam is provided at the other end of the envelope, as well as the control grid and the focusing and acceleration anodes of a conventional electron gun 22.

The electron beam 24 produced by the electron gun 22 is deflected in the vertical direction by the deflection apparatus 10 and subsequently is deflected in the horizontal direction by a pair of horizontal deflection plates 26 when deflection signals are applied thereto. After such deflection, the beam is accelerated through a high electrical field so that it strikes the phosphor screen 18 with a high velocity. This post deflection acceleration field is produced between a mesh electrode 28 and an acceleration electrode 30 in the form of a thin electron transparent aluminum layer coated over the inner surface of the phosphor screen 18 and electrically connected to a conductive layer 32 of gold coated on the inner surface of the ceramic funnel 14. The electrode layer 32 terminates just to the left of the mesh electrode 28 and is electrically connected through a lead-in connector 34 to an external source of high positive DC supply voltage of about +21 kilovolts.

The mesh electrode 28 is connected to ground through a support cylinder 36 attached at one end to a mounting ring 38 on which the mesh electrode 28 is supported and attached at its other end to spring contacts 40 which engage a conductive layer 42 coated on the inner surface of the glass neck 12 of the envelope. The mesh electrode 28 is connected to the average output voltage of the horizontal deflection plates 26 which is usually ground, and therefore provides a field free region between it and the output ends of the horizontal deflection plates 26.

The electrodes of the electron gun 22 and the mesh electrode 28 are connected to the exterior of the envelope through base pins 44 extending through the left end of the neck portion 12 of the envelope. However, the helical deflection members in the deflection apparatus 10 hereafter described, are connected to neck pins 46 and 48 extending through the side of the neck portion 12. The neck pins 46 and 48 are attached to the input end and the output end, respectively, of each helical deflection member. The horizontal deflection plates 26 are also connected to neck pins (not shown) which extend through the envelope neck portion.

Figure 2:
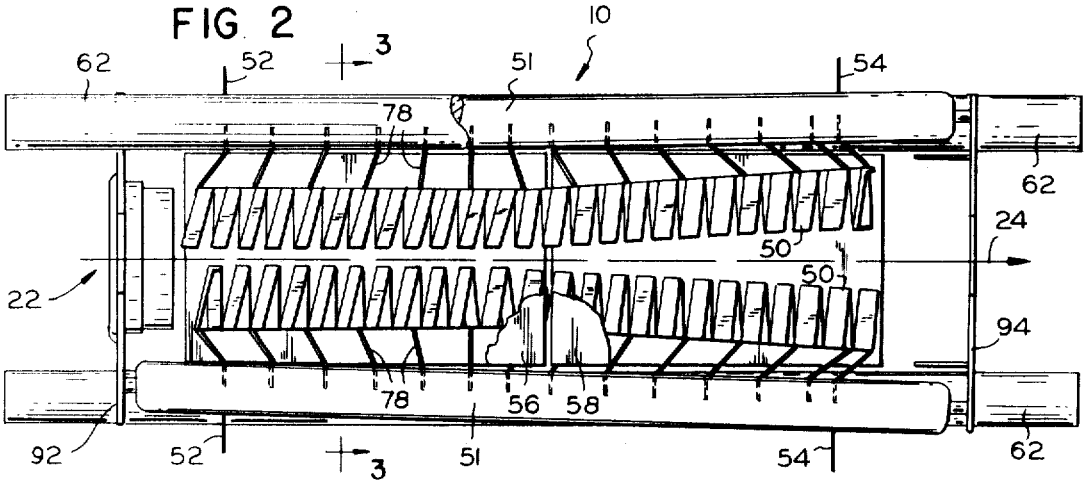
FIG. 2 is an enlarged plan view of the deflection apparatus used in the tube of FIG. 1 with the compensator plates partially broken away for purposes of clarity.

As shown in FIG. 2, the electron beam deflection apparatus 10 of the present invention includes a pair of helical deflection members 50 having a plurality of rectangular turns which are supported on a pair of glass support rods 51. The input ends of the helical deflectors are connected through input leads 52 to neck pins 46 while the output ends of such deflectors are connected through output leads 54 to neck pins 48. It should be noted that the helical deflectors 50 diverge apart at their output ends and such divergence or flaring starts about one-half way down the length of such deflectors.

Figure 3:
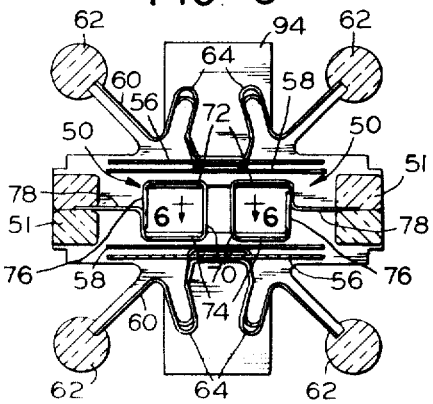
FIG. 3 is a vertical section view taken along the line 3—3 of FIG. 2.

As shown in FIGS. 1 to 3, two pairs of compensation plates 56 and 58 of flat sheet metal are mounted on opposite sides of both of the helical deflectors 50 adjacent the flat sides of the rectangular turns of such deflectors to provide ground conductors which, together with the signal conductors provided by the helical deflectors, form transmission lines of substantially uniform characteristic impedance. Each compensator plate extends across both helical deflectors substantially perpendicular to the deflector portion of the rectangular turns. Both pairs of compensator plates 56 and 58 are mounted so that a small gap exists between such plates at the point approximately half way down the length of the helical deflectors 50 where such deflectors begin to flare apart. This enables adjustment of the compensator plates 56 and 58 toward and away from the helical deflectors 50 in order to tune the transmission line and provide it with a more uniform characteristic impedance. Thus, the output end of the second compensator plate 58 may be spaced closer to the helical deflectors than is its input end in order to compensate for the flaring apart of such helical deflectors. This adjustable mounting of the compensator plates is accomplished by a pair of sinuously shaped wires 60 which are fixedly attached to such plates at an intermediate portion of such wires adjacent the opposite ends of the compensator plates in any suitable manner, such as by spot welding. The opposite ends of the support wires 60 are imbedded in a pair of glass support rods 62 which may extend down the entire length of the electron gun to support the other elements of such gun in a similar manner. Each of the support wires 60 includes a pair of U-shaped adjustment portions 64 which are flattened by squeezing the legs of such adjustment portions together to move the compensator plates away from the helical deflectors, and which are widened by moving such leg portions apart to cause the compensator plates to move closer to the deflection members. This adjustment can easily be done during manufacture by a pair of long nosed pliers to custom tune the delay lines. It should be noted that it may be possible with small manufacturing tolerances to eliminate the adjustable support wires and to fixedly mount the compensator plates using a conventional jig once the exact spacing of the compensator plate is determined for a production run.

Of course, a single compensator plate may be disposed along one of the sides of the helical deflectors while two or more compensator plates may be disposed along the other sides of the helical deflectors. Such compensator plates will be capable of adjustment via support wires 60. Alternatively, more than a pair of compensator plates may be adjustably disposed on each side of the helical deflectors.

Figure 5:
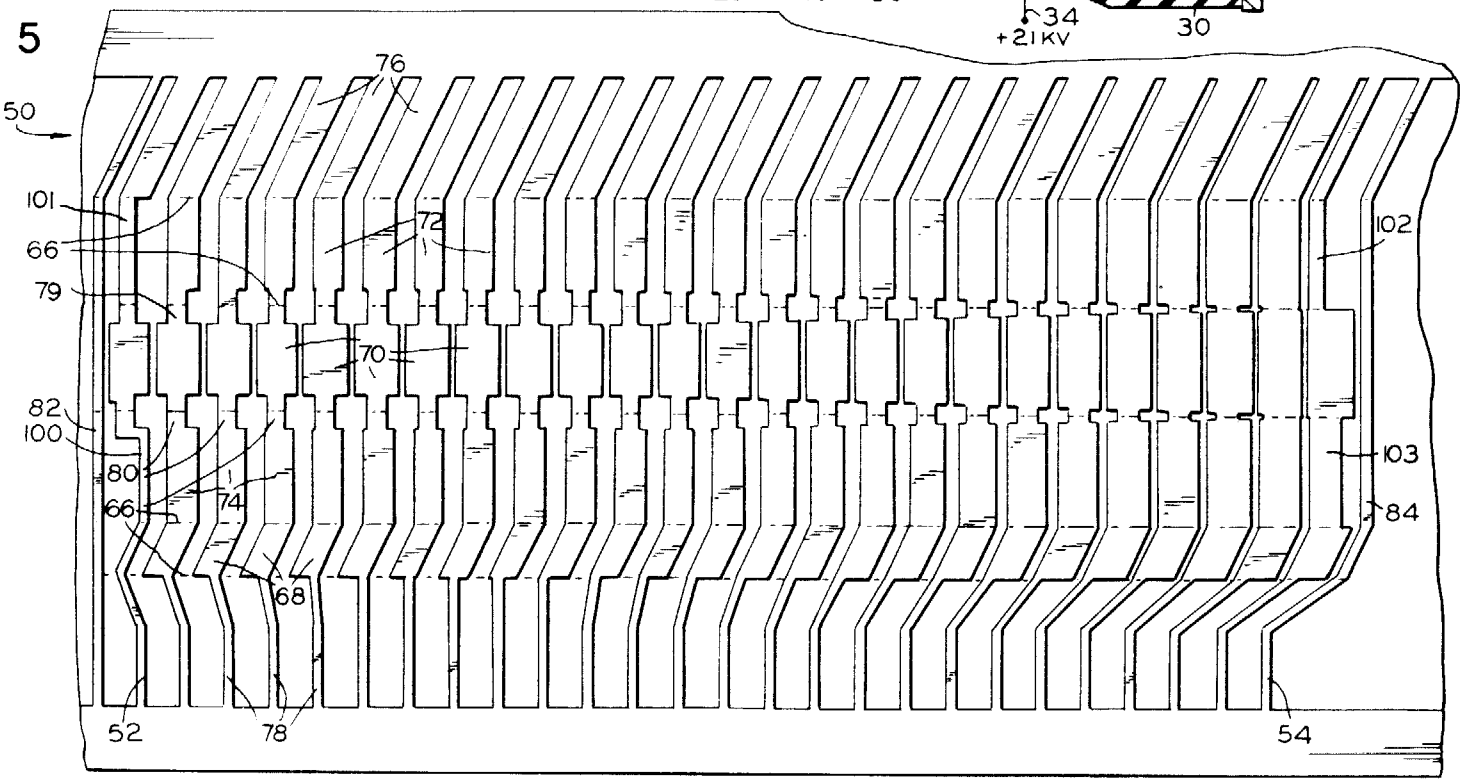
FIG. 5 is a plan view of a metal sheet member which is used to form one of the deflector members of FIGS. 2 and 3, before it is bent into the helical shape.

As shown in FIG. 5, each of the helical deflection members 50 is formed from a metal sheet which is cut or etched to provide a plurality of metal strips which are each bent along dashed lines 66 and subsequently welded together in series at tabs 68 to form the plurality of rectangular turns of the helical deflector member 50. Any suitable method can be employed such as that shown in U.S. Pat. No. 3,322,996 of Schrager granted May 30, 1967. Each of the rectangular turns includes a deflection portion 70 extending between a pair of flat side portions 72 and 74 and an outer portion 76 which is joined to the weld tab portion 68 of the next turn for connecting two adjacent turns together. It should be noted that each of the turns is provided with a thin mounting leg portion 78 extending from the welding tab portion 68 and such leg portions are bonded between two fused glass members forming the support rods 51, as shown in FIG. 3. Of course, some of the mounting legs 78 may be eliminated, for example, by removing the legs on alternate turns.

The width *in the beam direction* of the side portions 72 and 74 is different than that of the deflection portion 70, and increases successively along the path of the electron beam beginning at about the middle of the deflector so that the output turns have side portions of greater width than the input turns of the helical deflector member [40] *50* in order to compensate for the divergence of the helical deflectors. Also, the spacing between the side portions 72 and between the side portions 74 of adjacent turns successively decreases along the path of the electron beam. However, the width of the deflection portions 70 and the spacing between adjacent deflection portions remain substantially constant along the entire length of the deflector 50 to provide maximum deflection sensitivity and minimum capactive signal coupling between the deflection portions. A pair of intermediate portions 79 and 80 of reduced width are provided in each turn between the deflection portion 70 and side portions 72 and 74, respectively. The intermediate portions 79 and 80 are of less width than either the side portions or the deflector portions to provide a high inductance and low capacitance turn portion which compensates for the low inductance and high capacitance of the deflection portion. Thus, these intermediate portions provide the transmission line with more uniform characteristic impedance.

Each of the helical deflectors 50 is provided with an input support portion 82 and an output support portion 84 of less width than any of the other turns which serve as temporary supports during manufacture and are removed after mounting of the helical members on the support rods 51.

Figure 4:
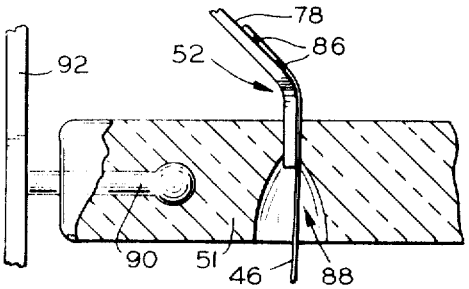
FIG. 4 is an enlarged partial section view of one of the lead-in connections at the ends of the helical deflector members of FIGS. 1 to 3.

As shown in FIG. 4, both the input conductor 52 and the output conductor 54 includes one of the leg portions 78 on the end of the helix 50 which is spot welded at welds 86 to a thin lead wire which extends through the wall of the glass wall portion of the envelope to form the neck pins 46 and 48. The lead wire 46 is thinner than the leg portion 78 forming part of the input conductor 52 and both are sealed in passageways extending through the glass support rod 51. The passageway has an outer opening 88 of a larger diameter than its inner opening so that at such outer opening the walls of the passageway are spaced away from the lead wire 46. This space reduces the capacitance between lead wire 46 and a mounting rod 90 attached to the end of the glass support rods 51. The mounting rods 90 are spot welded to second anode support 92 and isolation shield 94 provided at the opposite ends of the vertical deflection systems.

Figure 6:
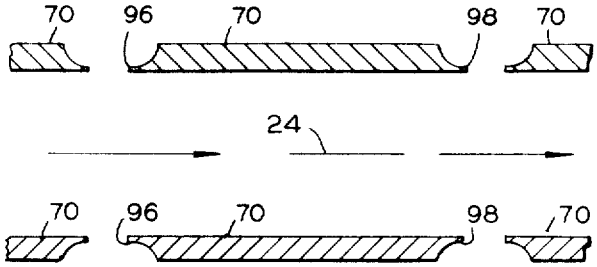
FIG. 6 is an enlarged horizontal section view taken along line 6—6 of FIG. 3.

As shown in FIG. 6, each of the deflection portions 70 of the helical deflection members is provided with a sharpened input edge 96 and a sharpened output edge 98 extending transversely across the path of the electron beam 24. These sharpened edges are positioned close to the inner surface of the deflection plate 70 adjacent the electron beam 24 to minimize the capacitance between adjacent deflection plate portions while provided a strong deflection field between the deflection plates 70 for deflecting the electron beam. This provides good deflection sensitivity and reduces undesirable capacitive coupling of the deflection signal from one deflection portion to another. Of course, this capacitive coupling of the signal is undesirable because it causes distortion of the deflection signal, which distortion is also imparted to the electron beam. Thus, sharpening of the edges of the deflection portions 70 enables better deflection sensitivity and lower distortion or a higher frequency response.

Sharpening of the deflection plate portions 70 may be accomplished by differential etching in which one side of the metal sheet of FIG. 5 is etched at a faster rate than the other side through a photo-resist mask during formation of the deflector turns. Of course, the sheet of FIG. 5 can also be cut by punching or stamping and etched from only one side to provide a sharpened edge about 0.002 inch thick when the deflection plate 70 is 0.010 inch thick. The etched portion extends about 0.010 inch from such edge at the outer side of the plate 7 to provide an increased spacing of 0.090 inch when the spacing between the sharpened edges is 0.020 inch.

Figure 7:
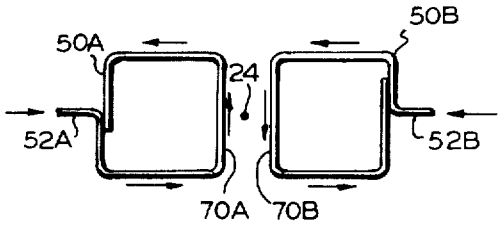
FIG. 7 is an enlarged elevation view of the input end of the helical deflectors of FIG. 2.

As shown in FIG. 7, the two helical deflector members are both wound in the same direction so they are not mirror images of each other. Thus, in the embodiment shown, the helical members are both counterclockwise windings. As a result, a deflection signal transmitted from the input conductor 52A through helical deflector 50A flows upward through its deflection plate portion 70A in an opposite direction to the downward flow of deflection signal *current* in deflection plate portion 70B of the other helical deflector 50B from input conductor 52B. As a result, the magnetic fields produced around the deflection plate portions 70A and 70B provide negative mutual inductive coupling between such deflection plate portions. This negative mutual inductive coupling provides the present deflection apparatus with a faster rise time than previous deflection apparatus emp'oying two helical deflectors wound in opposite directions so they are mirror images of each other.

As shown in FIG. 5, the first turn of the helical member 50 is provided with narrow input side portions 100 and 101 and the last turn of the helix is also provided with narrow output side portions 102 and 103 in order to provide a constant impedance along the entire length of the helix. The helical deflection member 50 may be made of a sheet of stainless steel approximately 0.01 inch thick and is approximately 2.5 inches long. Each rectangular turn of the helical member is about 0.216 by 0.216 inches in this example. It should be understood that the term "rectangular" as used herein to refer to the turns of the helical deflectors includes both squares and rectangles. The deflection portions 70 are 0.080 inch wide and are spaced apart about 0.02 inch. The side portions 72 and 74 are 0.050 inch wide and spaced apart 0.032 inch wide for the first eleven turns, and for the next 14 turns, the width increases from 0.052 to 0.078 inch while the spacing decreases from 0.048 to 0.029 inch *in* increments of 0.002 inch to compensate for divergence of the deflectors. The input side portion 100 of the first turn and the mounting legs 78 are all 0.015 inch wide, whereas the other input side portion is 0.020 inch wide. The output side portion 102 of the last turn is 0.020 inch wide, while the other output side portion 103 is 0.055 inch wide.

Figure 8:
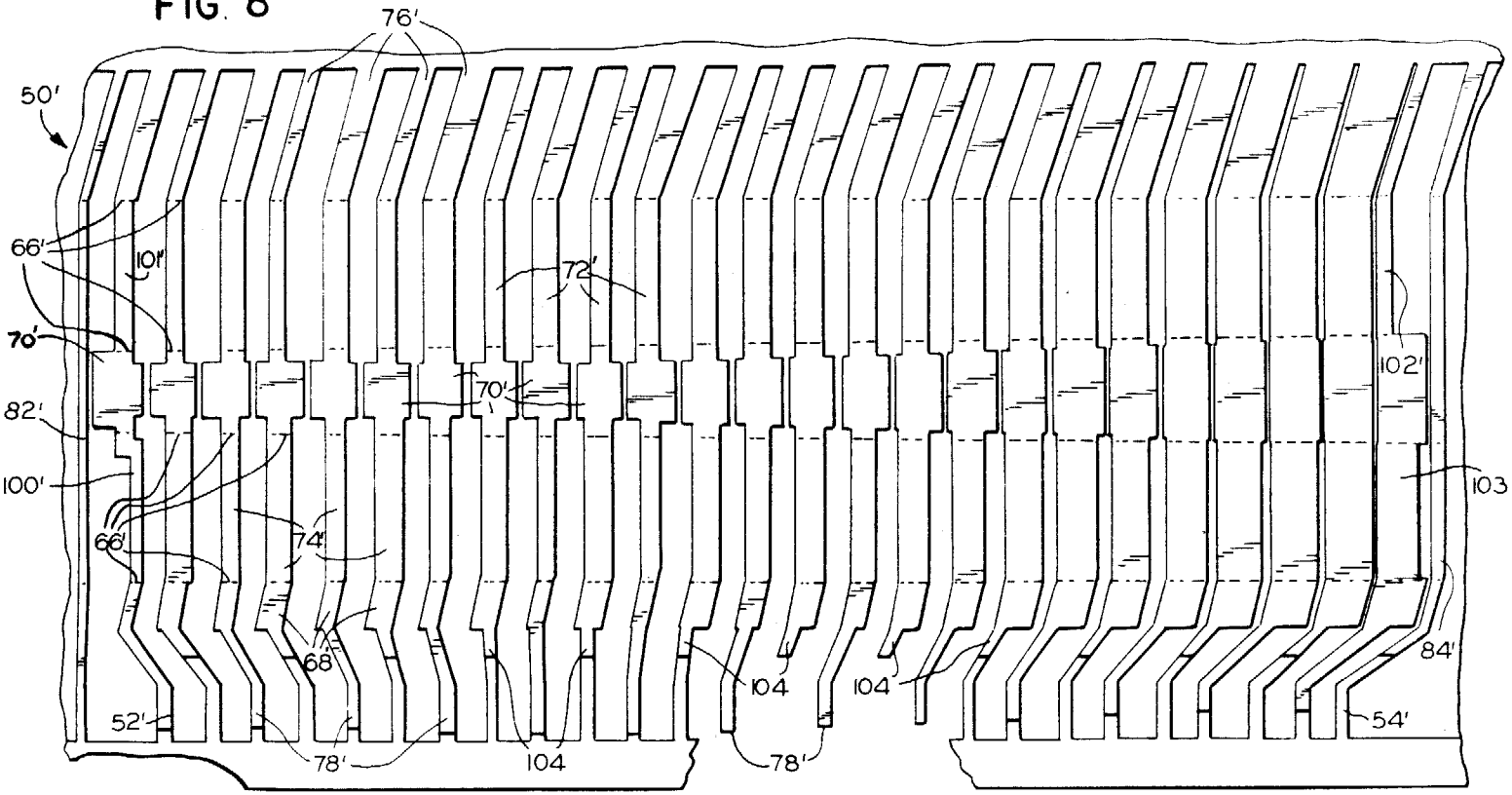
FIG. 8 is a plan view similar to FIG. 5 of another embodiment of the deflector member.

FIG. 5 shows an embodiment of the helical deflector member 50 in which a mounting leg 78 is provided on each turn. However, it may be desirable to omit every other mounting leg, and this embodiment of the deflector member 50' is shown in FIG. 8. The deflector member 50' is similar to that of FIG. 5 so that the same reference numerals, except for being primed, are used to designate like parts, and only the differences will be described. Thus, the side portions 72' and 74' of each turn extending between a support leg 78', and the two deflection plate portions 70' on opposite sides of such leg, are of less width than the side portions 72' and 74' of adjacent turns having no support legs but only a stub 104. For example, the first lower side portion 74' connected to the support legs serving as the input conductor 52' may be only 0.015 inch wide, while the third, fifth, seventh, ninth and 11th lower side portions 74' as well as the second, fourth, sixth, eighth and 10th upper side portions 72' are all only 0.035 inch wide because a support leg 78' is connected to each turn formed by a pair of the adjacent ones of these upper and lower side portions. However, the first upper side portion 72' is 0.020 inch wide while the third, fifth, seventh, ninth and 11th upper side portions 72', as well as the second, fourth, sixth, eighth and 10th lower side portions 72' are 0.050 inch wide because no support leg 78' is connected to each turn formed by a pair of the adjacent ones of these upper and lower side portions. The widths of the other side portions increases to compensate for the flaring apart of the two helical deflectors 50' at their output ends from the twelfth to the 25th deflection plates 70'. Thus, from the 12th to the 25th, the upper side portions 72' are, respectively, 0.0375, 0.054, 0.0425, 0.058, 0.0475, 0.062, 0.0525, 0.066, 0.0575, 0.070, 0.0625, 0.074, .0675, and 0.025 inches while the lower side portions are 0.052, 0.040, 0.056, 0.045, 0.060, 0.050, 0.064, 0.055, 0.068, 0.060, 0.072, 0.065, 0.076 and 0.070. It should be noted that the even numbered upper side portions and the odd numbered lower side portions form the turns connected to the support legs 78 so they are of less width than the two adjacent side portions on opposite sides thereof. Another difference in the embodiment of FIG. 8 over that of FIG. 5 is that the narrow intermediate portions 79 and 80 have been eliminated.

It will be obvious to those having skill in the art that many changes may be made in the above-described details of the preferred embodiment of the present invention without departing from the spirit of the invention. For example, the deflector apparatus 10 can be used in other cathode ray tubes including charge image storage tubes having transmission type mesh storage targets or simplified storage targets of a phosphor layer and target electrode coated on a glass support plate. Therefore, the scope of the present invention should only be determined by the following claims.

We claim:

1. An electron beam deflection tube in which the improvement comprises:

deflection means for deflecting an electron beam in said tube, including a pair of helical deflector members supported in spaced relationship on opposite sides of said beam, each of said helical members having a plurality of spaced turns positioned successively along the path of said beam with each turn including a pair of side portions separated by a deflector portion; and compensation means for forming transmission lines of substantially uniform characteristics with said helical members, including a plurality of compensator plates supported in spaced relationship on opposite sides of the helical members so that said compensator plates each extend across both helical members adjacent said side portions outside of said helical members.

2. A tube in accordance with claim 1 in which the compensator plates each extend along a plurality of deflector portions of both helical members substantially perpendicular to said deflector portions.

3. A tube in accordance with claim 1 in which the compensator plates are mounted on an adjustable support means for movement relative to the helical members.

4. A tube in accordance with claim 1 in which two pairs of compensator plates are employed and the helical members are mounted so their output ends are spaced further apart than their input ends and the pair of compensator plates adjacent said outputs ends are spaced closer to the helical members than the pair of compensator plates adjacent said input ends.

5. A tube in accordance with claim 3 in which the support means includes a pair of support rods of insulating material and a plurality of sinuously shaped wire members each attached at their opposite ends between said support rods and attached at an intermediate portion to one of the compensator plates.

6. A cathode ray tube in accordance with claim 1 which includes a phosphor screen that is struck by the electron beam and in which the helical members have rectangular turns.

7. A cathode ray tube in accordance with claim 6 which also includes post deflection acceleration means for accelerating the electron beam after it is deflected by said deflection means to cause said beam to strike the phosphor screen of said tube with greater velocity.

8. A cathode ray tube in which the improvement comprises:

deflection means for deflecting an electron beam in said tube, including at least one helical deflector member having a plurality of spaced turns positioned successively along the path of the beam including input turns at the beam input end and output turns at the beam output end of said deflection means;

at least some of said turns each having a deflector portion immediately adjacent said beam of a different width in the beam direction than side portions more remote from said beam and the widths of said side portions *of different turns* varying at different positions along the beam path so that *at least some of* the output turns have side portions of greater width than the input turns.

9. A tube in accordance with claim 8 in which the spacing between the deflector portions of adjacent turns is substantially uniform along the beam path, while the spacing between the side portions of adjacent turns varies along said beam path.

10. A tube in accordance with claim 8 in which a plurality of compensator plates are supported in spaced relationship on opposite sides of the helical members so that comensator plates each extend across both helical members adjacent said side portions.

11. A tube in accordance with claim 8 in which each of said turns includes a pair of intermediate portions between the opposite ends of said deflector portion and said side portions, said intermediate portions being of less width than said deflector portion and said side portions.

12. A tube in accordance with claim 8 in which the end turns at the opposite ends of the helical member each have a terminal side portion of less width than the other turns which is connected to an electrical lead extending through the envelope wall of said tube.

13. A tube in accordance with claim 12 in which said electrical lead is a thin wire of less width than said terminal side portion.

14. A tube in accordance with claim 13 in which the helical member is mounted on a support member of insulating material by leg portions projecting from at least some of the turns, and the lead wires are sealed in a pair of passageways extending through said support member adjacent metal mounting posts at the opposite ends of said support member, said passageways each having an outer end opening larger than its inner end opening to provide a space between the lead wire and the passageway wall at said outer end opening.

15. A tube in accordance with claim 8 in which the deflector portion of each turn has input and output edge portions of lesser thickness extending transversely across the beam path.

16. An electron beam deflection apparatus comprising:

a helical deflector member having a plurality of spaced turns adapted to be positioned successively along the path of the electron beam including input turns at the beam input end and output turns at the beam output end of the deflector member, at least some of said turns having a deflector portion immediately adjacent said beam of a greater width in the beam direction than side portions more remote from said beam and *at least some of* the output turns having side portions of greater width than the input turns.

17. Apparatus in accordance with claim 16 in which the spacing between the deflector portions of adjacent turns is substantially uniform along the beam path, while the spacing between the side portions of adjacent turns varies along said beam path.

18. Apparatus in accordance with claim 16 in which the width of the deflector portions is substantially uniform along the beam path, while the width of the side portions increases with distance along said beam path.

19. Apparatus in accordance with claim 16 in which each of said turns includes a pair of intermediate portions between the opposite ends of said deflector portion and said side portions, said intermediate portions being of less width than said deflector portions and said side portions.

20. Apparatus in accordance with claim 16 which includes two of said deflector members each having rectangular turns and mounted so that their output ends are spaced farther apart than their input ends.

21. Apparatus in accordance with claim 20 in which the spacing between the side portions of adjacent turns decreases and the width of said side portions increases with distance along said beam path from the input end to the output end of each deflector member.

22. Apparatus in accordance with claim 20 in which support legs are provided on alternate turns of each deflector member, and the two side portions of the turns extending between a support leg and the adjacent deflection plate portions are of less width than the side portions of adjacent turns having no support legs.

References Cited

The following references, cited by the Examiner, are of record in the patented file of this patent or the original patent.

UNITED STATES PATENTS

| | | | |
|---|---|---|---|
| 3,504,222 | 3/1970 | Fukushima | 315—3 |
| 3,374,386 | 3/1968 | Charbonnier | 313—83 SP |
| 3,376,464 | 4/1968 | Loty et al. | 313—75 X |
| 3,280,361 | 10/1966 | Goldberg et al. | 315—3 |
| 3,118,110 | 1/1964 | Spangenberg | 315—3 X |
| 2,832,001 | 4/1958 | Adler | 315—3.6 |
| 2,878,413 | 3/1959 | Adler | 315—3.6 |

FOREIGN PATENTS

| | | | |
|---|---|---|---|
| 16,697 | 3/1966 | Japan | 313—75 |

RUDOLPH V. ROLINEC, Primary Examiner

S. CHATMON, Jr., Assistant Examiner

U.S. Cl. X.R.

313—83, 83 SP; 315—3.6